United States Patent
Gutmann et al.

(10) Patent No.: US 11,742,853 B2
(45) Date of Patent: Aug. 29, 2023

(54) HOUSING FOR AN INDUCTIVE SENSOR, METHOD OF MANUFACTURING A HOUSING FOR AN INDUCTIVE SENSOR

(71) Applicant: SICK AG, Waldkirch (DE)

(72) Inventors: Frank Gutmann, Waldkirch (DE); Torsten Neuhaeuser, Waldkirch (DE); Wolfgang Marschner, Waldkirch (DE); Dominik Paul, Waldkirch (DE); Matthias Kopf, Waldkirch (DE)

(73) Assignee: SICK AG, Waldkirch (DE)

( * ) Notice: Subject to any disclaimer, the term of this patent is extended or adjusted under 35 U.S.C. 154(b) by 0 days.

(21) Appl. No.: 17/580,466

(22) Filed: Jan. 20, 2022

(65) Prior Publication Data
US 2022/0231685 A1    Jul. 21, 2022

(30) Foreign Application Priority Data
Jan. 21, 2021    (DE) .......................... 102021101181.7

(51) Int. Cl.
| H03K 17/95 | (2006.01) |
| G01R 27/26 | (2006.01) |
| G01R 33/02 | (2006.01) |
| G01R 15/18 | (2006.01) |

(52) U.S. Cl.
CPC ................... H03K 17/9505 (2013.01)

(58) Field of Classification Search
CPC .. G01R 27/2611; G01R 33/02; G01R 15/181; G01R 15/18
See application file for complete search history.

(56) References Cited

U.S. PATENT DOCUMENTS

| 7,825,655 B1* | 11/2010 | Stabel ...................... G01B 7/14 324/207.15 |
| 2009/0188321 A1* | 7/2009 | Schoen ................ G01D 11/245 73/632 |
| 2009/0203269 A1* | 8/2009 | Jenne ................. H03K 17/9505 439/862 |
| 2014/0026656 A1* | 1/2014 | Schwendimann ... H03K 17/955 73/431 |

(Continued)

FOREIGN PATENT DOCUMENTS

| DE | 8331837.2 U1 | 7/1984 |
| DE | 3717932 A1 | 12/1988 |

(Continued)

*Primary Examiner* — Jermele M Hollington
*Assistant Examiner* — Temilade S Rhodes-Vivour
(74) *Attorney, Agent, or Firm* — Nath, Goldberg & Meyer; Jerald L. Meyer

(57) ABSTRACT

A method of manufacturing a housing and a housing for an inductive sensor having at least one sleeve-like housing part and at least one beaker-like end cap for a sensor element, wherein the beaker-like end cap, wherein the end cap is composed of plastic, wherein the end cap is arranged in the sleeve-like housing part, wherein the end cap has a peripheral annular pressing surface that has an excess size with respect to an inner diameter of the housing part along an outer diameter of the sleeve-like section so that a press fit is formed between the sleeve like housing part and the end cap, and wherein a jacket-like outer surface of the sleeve-like section of the end cap does not have a step that projects beyond the inner diameter of the sleeve-like housing part.

9 Claims, 4 Drawing Sheets

(56) References Cited

U.S. PATENT DOCUMENTS

2016/0268737 A1* 9/2016 Gutmann ............. H01R 13/645

FOREIGN PATENT DOCUMENTS

| | | |
|---|---|---|
| DE | 3818499 C2 | 7/1991 |
| DE | 4135876 A1 | 5/1993 |
| DE | 9302714.1 U1 | 5/1993 |
| DE | 19641137 C2 | 7/1998 |
| DE | 10359885 A1 | 7/2005 |
| DE | 10237904 B4 | 5/2007 |
| DE | 10109442 B4 | 9/2007 |
| DE | 102007004895 A1 | 8/2008 |
| DE | 202013105906 U1 | 4/2014 |
| EP | 0695036 A1 | 1/1996 |
| JP | 200004869 A | 2/2000 |
| JP | 2011241844 A | 12/2011 |
| JP | 2014197528 A | 10/2014 |
| JP | 2020080222 A | 5/2020 |
| JP | 2020080227 A | 5/2020 |

* cited by examiner

HOUSING FOR AN INDUCTIVE SENSOR, METHOD OF MANUFACTURING A HOUSING FOR AN INDUCTIVE SENSOR

FIELD

The present invention relates to a housing for an inductive and to a method of manufacturing a housing for an inductive sensor.

BACKGROUND

Inductive sensors are used in a variety of ways in industrial use for the detection and monitoring of specific work routines. There are a plurality of different sensors which differ in their measurement operation, their design, and their size in dependence on their area of application. Contactlessly operating sensors such as inductive proximity switches are thus known which monitor a specific zone or which detect the position of an object. As a rule, end caps of plastic that are formed in one part are used in these inductive proximity switches or inductive proximity sensors.

Inductive proximity sensors are typically accommodated in a cylindrical metal sleeve. The sensor element, for example a coil, is seated at the one end of the metal sleeve in the end cap of plastic. A connection region having a plug or a line outlet is located at the other end of the metal sleeve. A circuit board is arranged therebetween.

Inductive sensors are usually manufactured with plastic caps so that the magnetic fields can reach the detection zone in front of the sensor without any greater impairments. Various plastic caps are provided for current inductive sensors and are arranged, for example, flush or not flush or minimally projecting at an end of the metal sleeve depending on the design of the inductive sensor.

A separate variant of a plastic cap is thus required for every sensor variant, however. A plurality of plastic caps or end caps are, however, required due to a large number of new sensor variants, which is, however, no longer practical and no longer inexpensive.

SUMMARY

It is an object of the invention to provide an improved housing for an inductive sensor without a plurality of different end caps being required.

The object is satisfied by a housing for an inductive sensor having at least one sleeve-like housing part and at least one beaker-like end cap for a sensor element, wherein the beaker-like end cap has a sleeve-like section, wherein the end cap is of plastic, wherein the end cap is arranged in the sleeve-like housing part, wherein the end cap has a peripheral annular pressing surface that has an excess size with respect to an inner diameter of the housing part along an outer diameter of the sleeve-like section so that a press fit is formed between the sleeve-like housing part and the end cap, and wherein a jacket-like outer surface of the sleeve-like section of the end cap does not have a step that projects beyond the inner diameter of the sleeve-like housing part.

The object is further satisfied by a method of manufacturing a housing for an inductive sensor having at least one sleeve-like housing part and at least one beaker-like end cap for a sensor element, wherein the beaker-like end cap has a sleeve-like section, wherein the end cap is of plastic, wherein the end cap is arranged in the sleeve-like housing part, wherein the end cap has a peripheral annular pressing surface that has an excess size with respect to an inner diameter of the housing part along an outer diameter of the sleeve-like section so that a press fit is formed between the sleeve-like housing part and the end cap once the end cap has been pushed into the housing part, and wherein a jacket-like outer surface of the sleeve-like section of the end cap does not have a step that projects beyond the inner diameter of the sleeve-like housing part.

The end cap does not have a step that projects beyond the inner diameter of the sleeve-like housing part and that could form a mechanical abutment at the outer surface of the sleeve-like section or at a jacket-like outer surface of the sleeve-like section. The beaker-like end cap can thus be displaced as desired in the sleeve-like housing part without a mechanical abutment being present. The end cap can in particular be pushed flush unto the sleeve-like housing part.

The end cap is configured as a universal end cap in accordance with the invention with which different end caps within one construction size of the sensor become superfluous and can nevertheless map the different overhangs. In accordance with the invention, identical end caps can be fastened and fixed to the end of the sleeve-like housing part with different overhangs or flush. End caps that are less expensive in manufacture are thereby possible since only one tool is required for an end cap of one type that can be used for a plurality of different sensors.

The end cap is pushed just as far as necessary into the sleeve-like housing part, but so far that the peripheral annular pressing surface is completely surrounded by the sleeve-like housing part. A part of the beaker-like end cap thus still projects from the sleeve-like housing part, however, if this is required for the desired sensor variant. The beaker-like end cap can, however, also be pushed up to the margin of the sleeve-like housing part flush with the sleeve-like housing part, if this is required for the desired sensor variant.

A pushing of the end cap into the sleeve-like housing part can take place by the simple hand of a production mechanic in the simplest case. However, a device for installing the housing can also be provided. The sleeve-like housing part and the end cap are placed into the device. The end cap is then pressed by means of an abutment of the installation device into the sleeve-like housing part up to a desired dimension that is predefined by the abutment. It is understood that the installation device can be highly automated and can be equipped with a plurality of possible abutments or has a measurement system to push the end cap into the sleeve-like housing by a predetermined dimension. A drive can furthermore be present to push the beaker-like end cap into the housing part in an automated manner.

The sensor element, for example a coil, is seated at the one end of the housing part in the end cap of plastic. A connection region having, for example, a plug or a line outlet is located at the other end of the housing part. A circuit board having a control and evaluation unit is arranged therebetween, for example.

The sleeve-like housing part is of metal in a further development of the invention. The housing part is preferably of brass. The housing sleeve can, however, be formed from steel or stainless steel, for example. The housing sleeve is thereby mechanically robustly formed. The housing sleeve can be smooth at the outer surface. A thread can, however, also be formed at the outer surface so that the housing can be screwed in or can be simply fixed by means of nuts.

In a further development of the invention, the end cap has peripheral annular sealing ribs along an outer diameter that have an excess size with respect to an inner diameter of the housing part so that a seal is formed between the sleeve-like housing part and the end cap. The sealing ribs are here preferably connected to the end cap in one piece. A plurality of sealing ribs are, for example, arranged in parallel with one another. The sealing ribs are arranged, for example, between the front face and the pressing surface of the end cap. The end cap has a surface between the sealing ribs and the front face that projects partly from the housing part depending on the insertion depth.

In a further development of the invention, the beaker-like end cap has an annular taper, that is in particular peripheral, at an outer diameter at the open end, whereby an introduction device is formed. The end cap can thereby be simply placed onto the sleeve-like housing part, can be centered, and can be simply pushed into the sleeve-like housing part.

In a further development of the invention, the beaker-like end cap has a centering pin centrally directed in the direction of the inner space at the front face. The centering pin serves for the reception of the sensor element, whereby the sensor element is positioned and can be fixed, for example. The sensor element can be automatically positioned by the centering pin. The centering pin is arranged perpendicular to the front face, for example.

In a further development of the invention, the front face of the beaker-like end cap has a greater wall thickness than the sleeve-like section of the beaker-like end cap. The front face is thereby formed as more stable than the sleeve-like section of the end cap, whereby a deformation of the front face by the joining process is avoided, whereby the exact position and alignment of the sensor element is ensured.

In a further development of the invention, the beaker-like end cap has at least one marking at an outer surface of the sleeve-like section for the introduction depth of the end cap into the sleeve-like housing part. A correct positioning of the end cap can thereby be carried out and checked in production. It is in particular very simple to make a visual inspection on a manual installation as to whether a provided part of the marking is still visible and whether a provided part is covered by the sleeve-like housing part.

In a further development of the invention, the beaker-like end cap is adhesively bonded to the inner surface of the sleeve-.like housing part at an outer surface of the sleeve-like section. The position of the end cap can thereby be finally fixed so that the end cap is no longer displaceable and is also connected in a firmly fixed manner to the sleeve-like housing part on higher mechanical strains.

In a further development of the invention, the beaker-like end cap is molded with the sleeve-like housing part. The beaker-like end cap can in particular be molded after the fixing with the sleeve-like housing part when the sleeve-like housing part is likewise of plastic so that a connection with material continuity is present.

BRIEF DESCRIPTION OF THE DRAWINGS

The invention will also be explained in the following with respect to further advantages and features with reference to the enclosed drawing and to embodiments. The Figures of the drawing show in.

DETAILED DESCRIPTION

Figure 1:
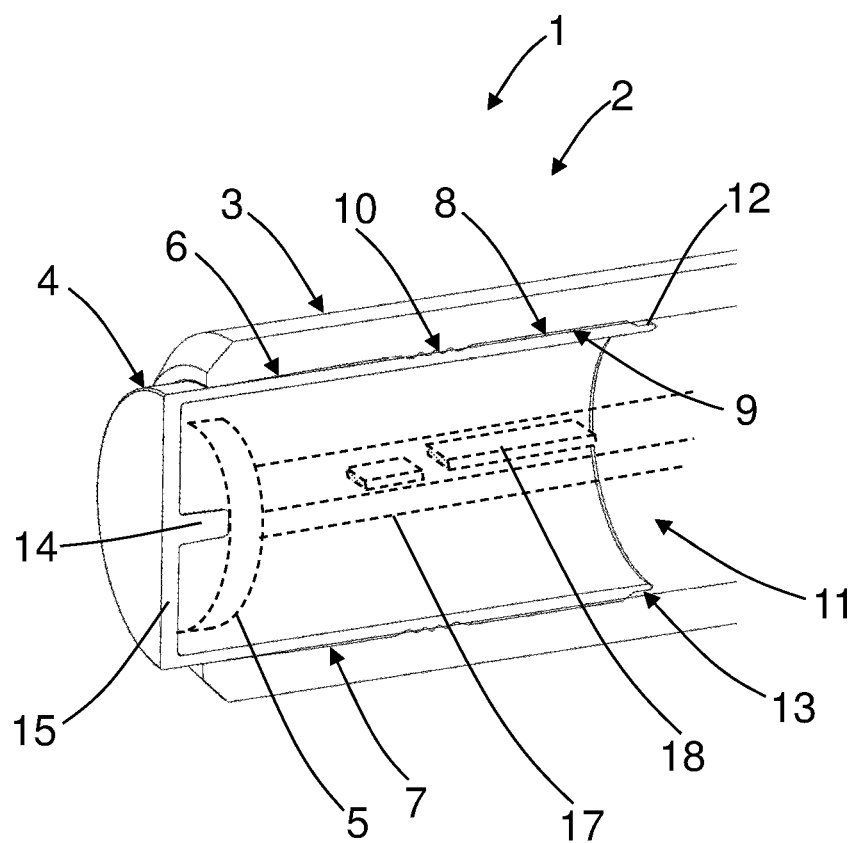
FIG. 1 a housing for an inductive sensor.

In the following Figures, identical parts are provided with identical reference numerals.

FIG. 1 shows a housing 1 for an inductive sensor 2 having at least one sleeve-like housing part 3 and at least one beaker-like end cap 4 for a sensor element 5, wherein the beaker-like end cap 4 has a sleeve-like section 6, wherein the end cap 4 is of plastic, wherein the end cap 4 is arranged in the sleeve-like housing part 3, wherein the end cap 4 has a peripheral annular pressing surface 8 that has an excess size with respect to an inner diameter 9 of the housing part 3 along an outer diameter 7 of the sleeve-like section 6 so that a press fit is formed between the sleeve like housing part 3 and the end cap 4, and wherein a jacket-like outer surface of the sleeve-like section 6 of the end cap 4 does not have a step that projects beyond the inner diameter 9 of the sleeve-like housing part 3.

The end cap 4 is in particular designed as a universal end cap in accordance with FIGS. 3 to 6, with identical end caps 4 being able to be fastened and fixed with different overhangs or flush with the end of the sleeve-like housing part 3.

The end cap 4 in accordance with FIG. 1 is pushed just as far as necessary into the sleeve-like housing part 3, but so far that the peripheral annular pressing surface 8 is completely surrounded by the sleeve-like housing part 3. A part of the beaker-like end cap 4 thus still projects from the sleeve-like housing part 4, however, if this is required for the desired sensor variant.

The beaker-like end cap 4 can, however, also be pushed up to the margin of the sleeve-like housing part 3 flush with the sleeve-like housing part 3, if this is required for the desired sensor variant.

A pushing of the end cap 4 into the sleeve-like housing part 3 can take place by the simple hand of a production mechanic in the simplest case. However, a device for installing the housing 1 can also be provided. At least the sleeve-like housing part 3 and at least the end cap 4 are placed into the device. The end cap 4 is then pressed by means of an abutment of the installation device into the sleeve-like housing part 3 up to a desired dimension that is predefined by the abutment.

The sensor element 5, for example a coil, is seated in accordance with FIG. 1 at the one end of the housing part 3 in the end cap 4 of plastic. A connection region, not shown, having, for example, a plug or a line outlet is located at the other end of the housing part 3. A circuit board 17 having a control and evaluation unit 18 is arranged therebetween, for example The sleeve-like housing part 3 is of metal, for example. The housing part 3 is preferably of brass. The housing part 3 or the housing sleeve can, however, be formed from steel or stainless steel, for example. The housing part 3 can be smooth at the outer surface. A thread can, however, also be formed at the outer surface so that the housing 1 or the housing part 3 can be screwed in or can be simply fixed by means of nuts.

Figure 2:
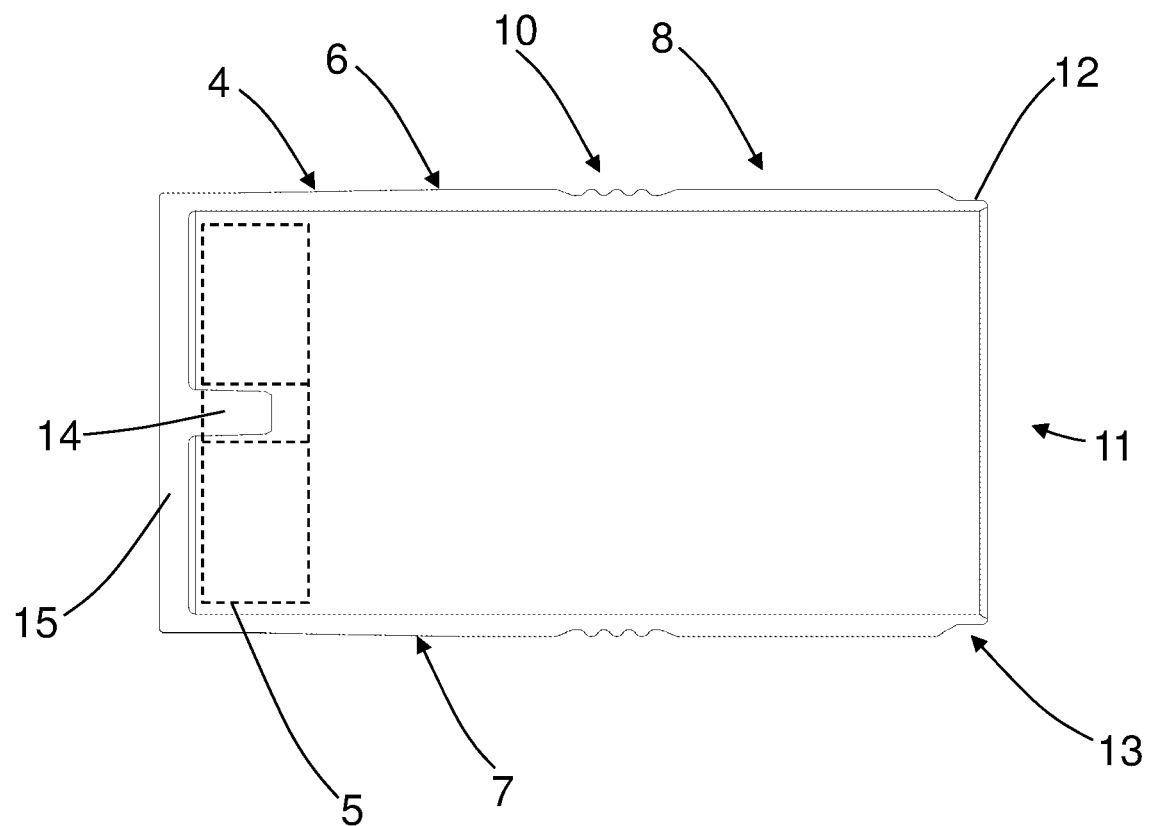
FIG. 2 a beaker-like end cap for an inductive sensor.

In accordance with FIG. 2, the end cap 4 has peripheral annular sealing ribs 10 along an outer diameter that have an excess size with respect to an inner diameter 9 of the housing part 3 so that a seal is formed between the sleeve-like housing part 3 and the end cap 4. The sealing ribs 10 are here preferably connected to the end cap 4 in one piece. A plurality of sealing ribs 10 are, for example, arranged in parallel with one another. The sealing ribs 10 are arranged, for example, between the front face 15 and the pressing surface 8 of the end cap 4. The end cap 4 has a surface between the sealing ribs 10 and the front face 15 that projects partly from the housing part depending on the insertion depth.

In accordance with FIG. 2 the beaker-like end cap 4 has an annular taper 12, that is in particular peripheral, at an outer diameter at the open end, whereby an introduction device 13 is formed. The end cap 4 can thereby be simply placed onto the sleeve-like housing part 3, can be centered, and can be simply pushed into the sleeve-like housing part 3.

In accordance with FIG. 2, the beaker-like end cap 4 has a centering pin 14 centrally directed in the direction of the inner space at the front face 15. The centering pin 14 serves for the reception of the sensor element 5, whereby the sensor element 5 is positioned and can be fixed, for example. The sensor element 5 can be automatically positioned by the centering pin 14. The centering pin 14 is arranged perpendicular to the front face 15, for example.

In accordance with FIG. 2, the front face 15 of the beaker-like end cap 4 has a greater wall thickness than the sleeve-like section 6 of the beaker-like end cap 4. The front face 15 is thereby formed as more stable than the sleeve-like section 6 of the end cap 4, whereby a deformation of the front face 15 by the joining process is avoided, whereby the exact position and alignment of the sensor element 5 is ensured.

Figure 3:
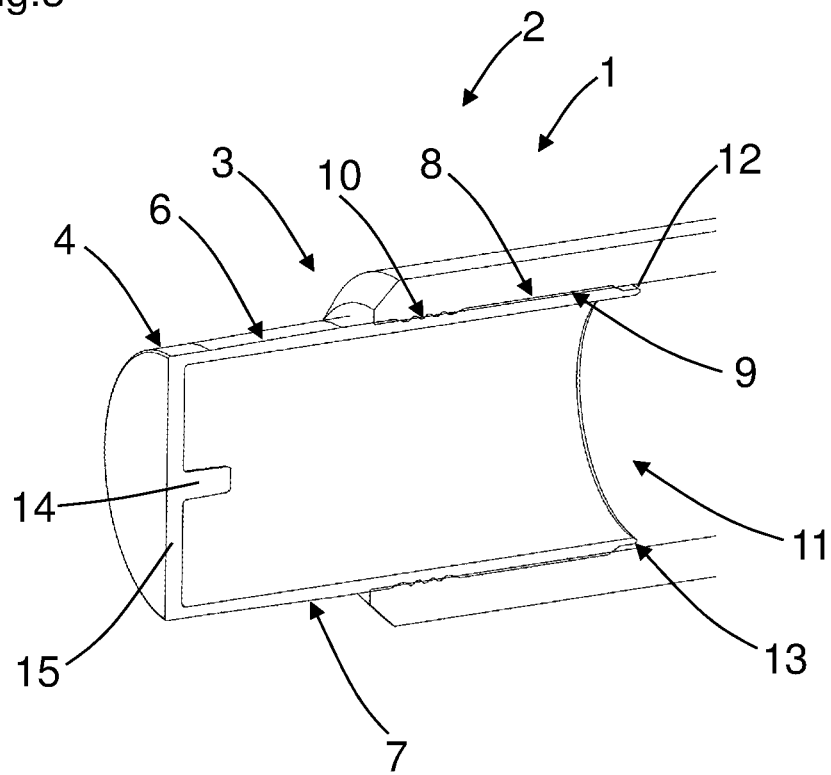
FIGS. 3 to 6 in each case, a housing for an inductive sensor.
Figure 4:
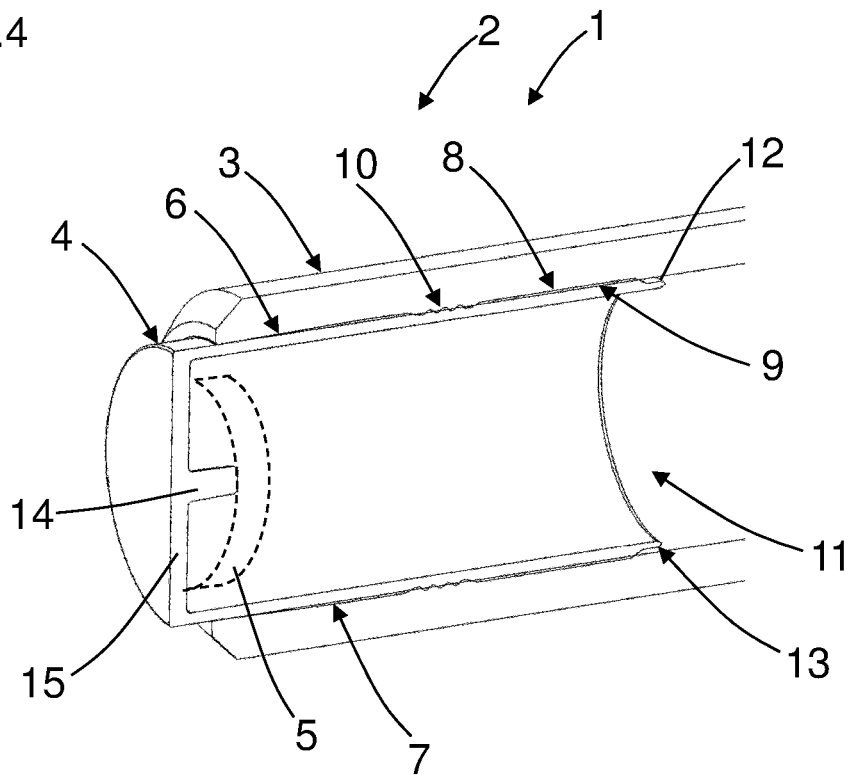
Figure 5:
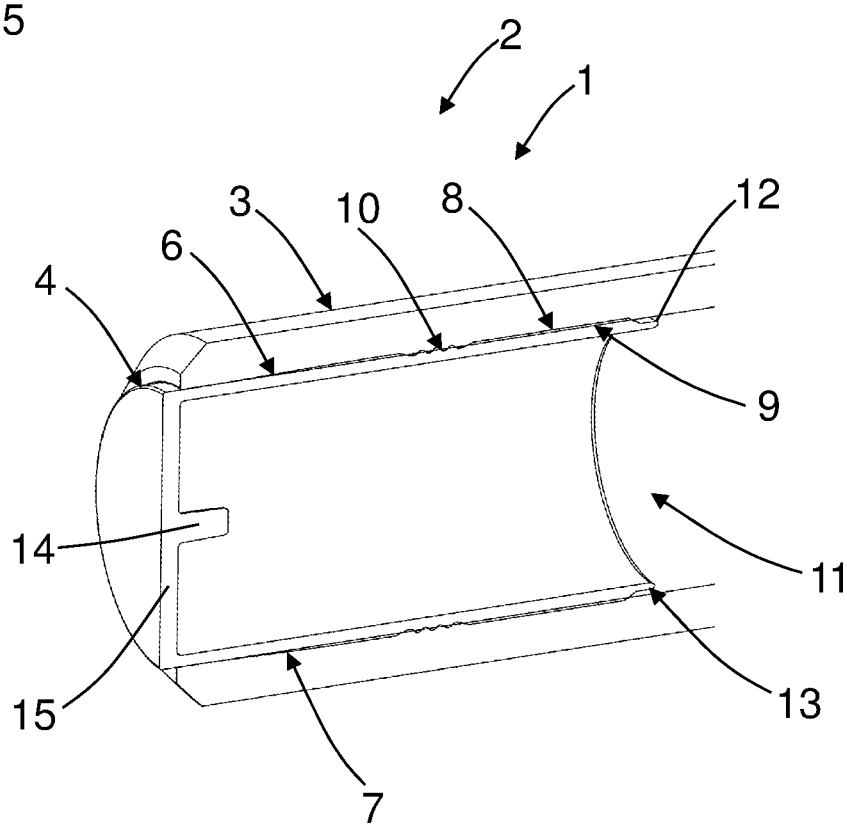
Figure 6:
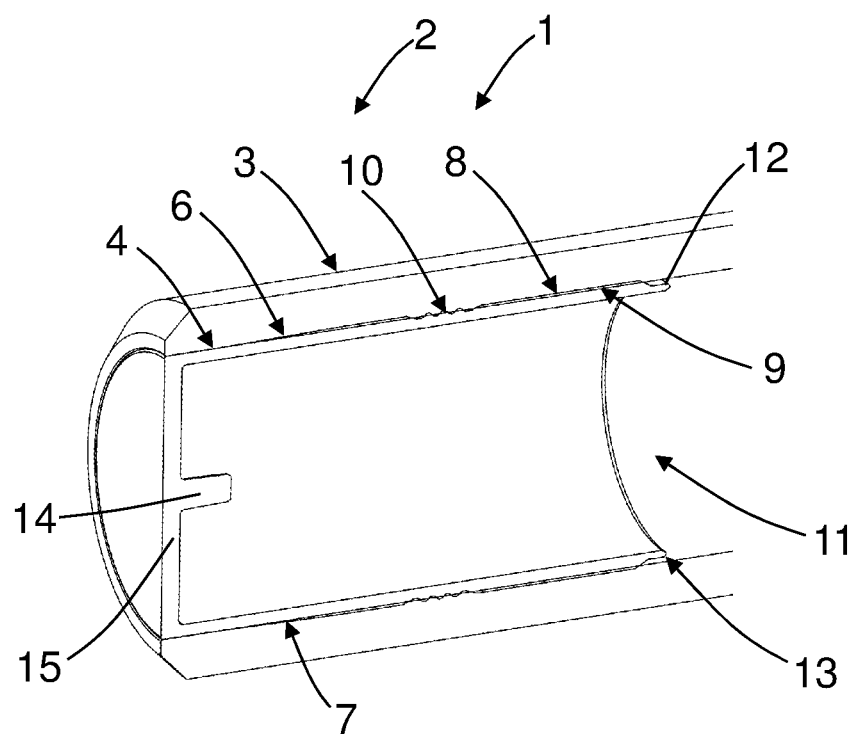

In accordance with FIG. 3, the beaker-like end cap 4 has at least one marking 16 at an outer surface of the sleeve-like section for the introduction depth of the end cap 4 into the sleeve-like housing part 3. A correct positioning of the end cap 4 can thereby be carried out and checked in production. It is in particular very simple to make a visual inspection on a manual installation as to whether a provided part of the marking 16 is still visible and whether a provided part is covered by the sleeve-like housing part 3.

For example, the beaker-like end cap 4 is adhesively bonded to the inner surface of the sleeve-.like housing part 3 at an outer surface of the sleeve-like section 6. The position of the end cap 4 can thereby be finally fixed so that the end cap 4 is no longer displaceable and is also connected in a firmly fixed manner to the sleeve-like housing part 3 on higher mechanical strains.

For example, the beaker-like end cap 4 is molded with the sleeve-like housing part 3. The beaker-like end cap 4 can in particular be molded after the fixing with the sleeve-like housing part 3 when the sleeve-like housing part 3 is likewise composed of plastic so that a connection with material continuity is present.

REFERENCE NUMERALS

1 housing
2 Inductive sensor
3 sleeve-like housing part
4 beaker-like end cap
5 sensor element
6 sleeve-like section
7 outer diameter of the sleeve-like section
8 annular pressing surface
9 inner diameter of the housing part
10 annular sealing ribs
11 open end of the end cap
12 taper
13 introduction device
14 centering pin
15 front face of the beaker-like end cap
16 markings
17 circuit board
18 control and evaluation unit

The invention claimed is:

1. A housing for an inductive sensor having at least one sleeve-like housing part and at least one beaker-like end cap for a sensor element,
   wherein the beaker-like end cap has a sleeve-like section,
   wherein the end cap is of plastic,
   wherein the end cap is arranged in the sleeve-like housing part,
   wherein the end cap has a peripheral annular pressing surface that has an excess size with respect to an inner diameter of the housing part along an outer diameter of the sleeve-like section so that a press fit is formed between the sleeve-like housing part and the end cap, with a jacket-like outer surface of the sleeve-like section of the end cap not having a step that projects beyond the inner diameter of the sleeve-like housing part,
   and wherein the beaker-like end cap has at least one marking at an outer surface of the sleeve-like section for the introduction depth of the end cap into the sleeve-like housing part.

2. The housing in accordance with claim 1, wherein the sleeve-like housing part is of metal.

3. The housing in accordance with claim 1, wherein the end cap has peripheral annular sealing ribs along an outer diameter that have an excess size with respect to an inner diameter of the housing part so that a seal is formed between the sleeve-like housing part and the end cap.

4. The housing in accordance with claim 1, wherein the beaker-like end cap has a taper at an outer diameter at the open end, whereby an introduction device is formed in the sleeve-like housing part.

5. The housing in accordance with claim 1, wherein the beaker-like end cap has a centering pin centrally directed in the direction of the inner space at the front face.

6. The housing in accordance with claim 1, wherein the front face of the beaker-like end cap has a larger wall thickness than the sleeve-like section of the beaker-like end cap.

7. The housing in accordance with claim 1, wherein the beaker-like end cap is adhesively bonded to the inner surface of the sleeve-like housing part at an outer surface of the sleeve-like section.

8. The housing in accordance with claim 1, wherein the beaker-like end cap is molded with the sleeve-like housing part.

9. A method of manufacturing a housing for an inductive sensor having at least one sleeve-like housing part and at least one beaker-like end cap for a sensor element,
   wherein the beaker-like end cap has a sleeve-like section,
   wherein the end cap is of plastic,
   wherein the end cap is arranged in the sleeve-like housing part,
   wherein the end cap has a peripheral annular pressing surface that has an excess size with respect to an inner diameter of the housing part along an outer diameter of the sleeve-like section so that a press fit is formed between the sleeve-like housing part and the end cap once the end cap has been pushed into the housing part, with a jacket-like outer surface of the sleeve-like section of the end cap not having a step that projects beyond the inner diameter of the sleeve-like housing part,
   and wherein the beaker-like end cap has at least one marking at an outer surface of the sleeve-like section for the introduction depth of the end cap into the sleeve-like housing part.

* * * * *